US009570352B2

(12) United States Patent
Brunnbauer et al.

(10) Patent No.: US 9,570,352 B2
(45) Date of Patent: Feb. 14, 2017

(54) METHOD OF DICING A WAFER AND SEMICONDUCTOR CHIP

(71) Applicant: Infineon Technologies AG, Neubiberg (DE)

(72) Inventors: Markus Brunnbauer, Lappersdorf (DE); Bernhard Drummer, Tegernheim (DE); Korbinian Kaspar, Regensburg (DE); Gunther Mackh, Neumarkt (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/964,603

(22) Filed: Dec. 10, 2015

(65) Prior Publication Data
US 2016/0211178 A1 Jul. 21, 2016

(30) Foreign Application Priority Data

Jan. 20, 2015 (DE) .................. 10 2015 100 783

(51) Int. Cl.
*H01L 29/06* (2006.01)
*H01L 21/78* (2006.01)
(52) U.S. Cl.
CPC .......... *H01L 21/78* (2013.01); *H01L 29/0657* (2013.01)
(58) Field of Classification Search
CPC .............. H01L 21/78; H01L 21/30604; H01L 21/3043; H01L 29/0657
USPC ....................................... 257/618
See application file for complete search history.

(56) References Cited

U.S. PATENT DOCUMENTS

| 8,809,120 | B2 | 8/2014 | Miccoli et al. |
| 2003/0067001 | A1 | 4/2003 | Poo et al. |
| 2006/0040472 | A1 | 2/2006 | Tamura et al. |
| 2013/0267076 | A1* | 10/2013 | Lei .......... H01L 21/78 438/460 |
| 2014/0017880 | A1 | 1/2014 | Lei et al. |
| 2014/0113390 | A1* | 4/2014 | Ploessl ............ H01L 33/0095 438/16 |
| 2014/0141596 | A1 | 5/2014 | Matsuzaki et al. |
| 2014/0154869 | A1 | 6/2014 | Geerpuram et al. |
| 2014/0213042 | A1 | 7/2014 | Lei et al. |
| 2015/0187991 | A1* | 7/2015 | McGroddy ......... H01L 27/016 257/13 |

OTHER PUBLICATIONS

D. Pays-Volard et al., "Productivity Improvement Using Plasma-based Die Singulation", International Conference on Compound Semiconductor Manufacturing Technology, May 2014, Denver, Colorado, USA.

* cited by examiner

*Primary Examiner* — Tu-Tu Ho
(74) *Attorney, Agent, or Firm* — Viering, Jentschura & Partner mbB

(57) ABSTRACT

A method of dicing a wafer may include forming a plurality of active regions in a wafer, each active region including at least one electronic component, the active regions extending from a first surface of the wafer into the wafer by a height and being separated by separation regions, the separation regions being free from metal, forming at least one trench in the wafer by plasma etching in at least one separation region from the first surface of the wafer. The at least one trench is extending into the wafer farther than the plurality of active regions. The method may further include processing a remaining portion of the wafer in the separation region to separate the wafer into individual chips.

15 Claims, 6 Drawing Sheets

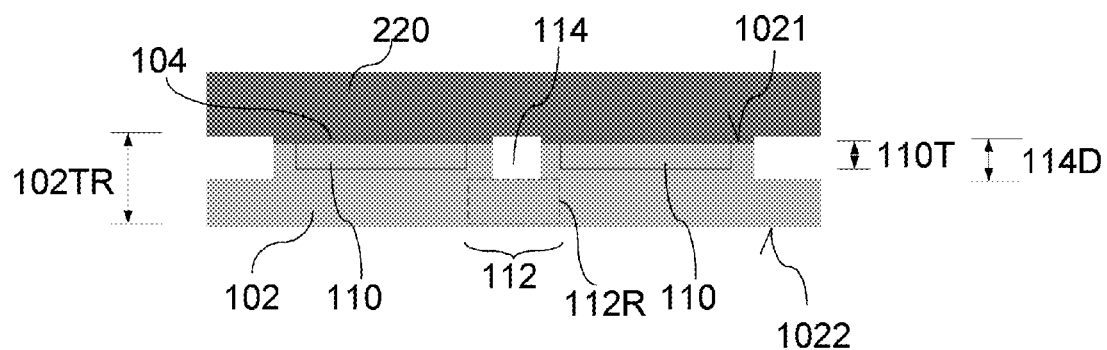
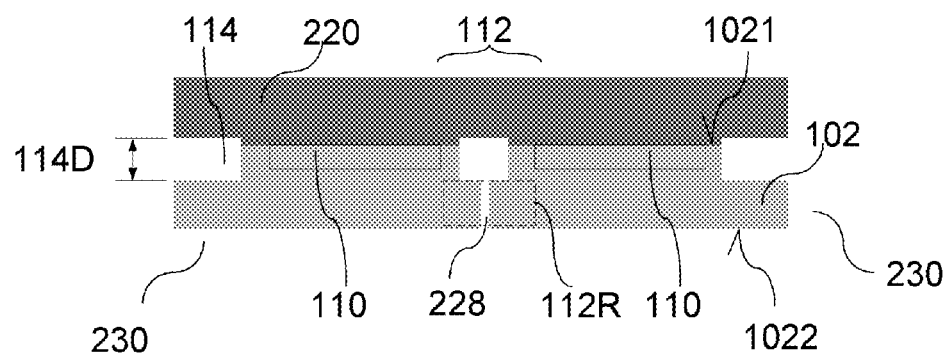
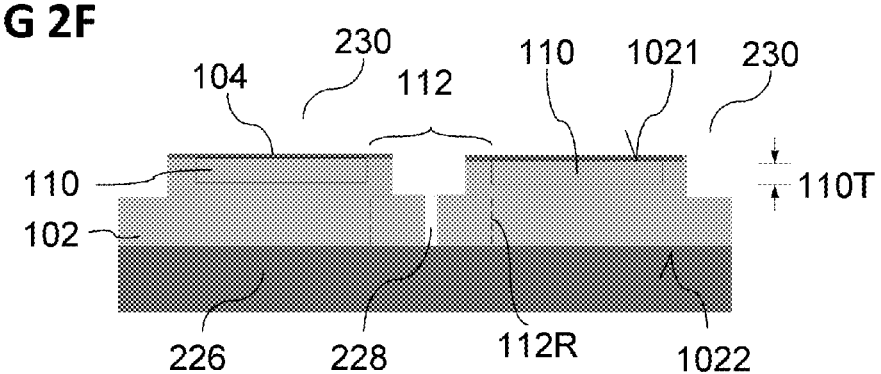

610 — forming a plurality of active regions in a wafer, each active region including at least one electronic component, the active regions extending from a first surface of the wafer into the wafer by a height and being separated by separation regions, the separation regions being free from metal 620 — forming at least one trench in the wafer by plasma etching in at least one separation region from the first surface of the wafer, wherein the at least one trench is extending into the wafer farther than the plurality of active regions 630 — processing a remaining portion of the wafer in the separation region to separate the wafer into individual chips

METHOD OF DICING A WAFER AND SEMICONDUCTOR CHIP

CROSS-REFERENCE TO RELATED APPLICATION

This application claims priority to German Patent Application Serial No. 10 2015 100 783.5, which was filed Jan. 20, 2015, and is incorporated herein by reference in its entirety.

TECHNICAL FIELD

Various embodiments relate generally to a method of dicing a wafer and to a semiconductor chip.

BACKGROUND

Particularly wafers including small chips, for example chips formed using a 65 nm technology (or even smaller), may include layers with a small dielectric constant, so-called low-k-layers. The low-k-layers may be rather brittle, for example more brittle than silicon dioxide or other typically used dielectrics. This may cause problems when the wafer is sawed for dicing it into individual chips. The individual chips may suffer from so-called chipping (small chips of material broken off at newly formed edges of the chips). The chipping may be so severe that the chips have to be discarded.

In order to avoid a functionality of the chips to suffer from the chipping, a separation between functional areas of the chips, in which the dicing may be performed, may be enlarged. However, this may decrease a number of chips per wafer and thereby increase manufacturing costs.

Alternatively, the brittle layers may be separated using a laser, e.g. by laser ablation (also referred to as laser grooving). However, both the ablated material (which may settle on the chips) and/or heat introduced by the laser into the wafer, e.g. into active regions of the chips, may cause damage to the chips, which may have to be discarded. This means that a yield of the production process may be reduced, thereby increasing manufacturing costs.

SUMMARY

A method of dicing a wafer may include forming a plurality of active regions in a wafer, each active region including at least one electronic component, the active regions extending from a first surface of the wafer into the wafer by a height and being separated by separation regions, the separation regions being free from metal, forming at least one trench in the wafer by plasma etching in at least one separation region from the first surface of the wafer. The at least one trench is extending into the wafer farther than the plurality of active regions. The method further includes processing a remaining portion of the wafer in the separation region to separate the wafer into individual chips.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A to FIG. 2F show various stages of a method of dicing a wafer in accordance with various embodiments;

FIG. 4 shows a schematic process flow of a method of dicing a wafer in accordance with various embodiments.

DESCRIPTION

Figure 1A:
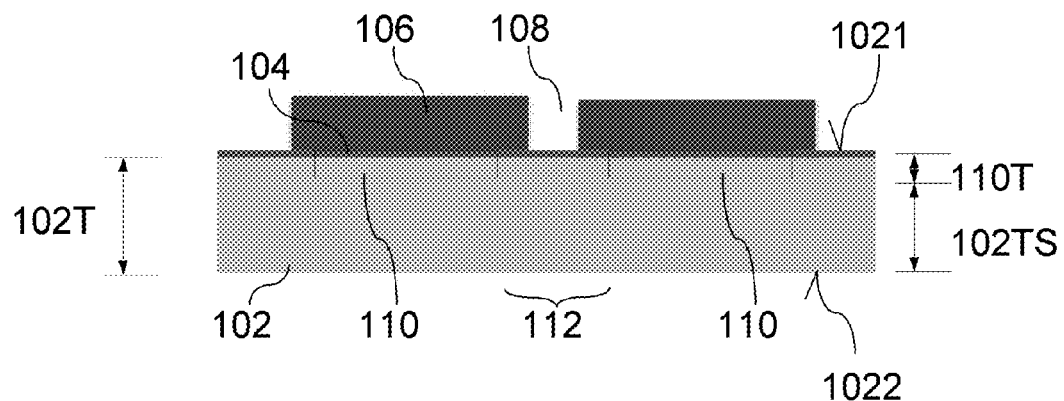
FIG. 1A to FIG. 1F show various stages of a method of dicing a wafer in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In the following, an "active region" may refer to a region in a semiconductor wafer or a semiconductor chip that may include at least one electronic component, e.g. a transistor, a diode or the like. It may for example include an integrated circuit.

In the following, a "separation region" may refer to a region between two adjacent active regions in a wafer (and/or to a region between an active region and an edge of the wafer).

In various embodiments, for singulating a wafer into individual chips, also referred to as dicing, new processes may be incorporated for improving a dicing result for narrow separation regions (typically, a separating the wafer into individual chips may be carried out in the separation regions), and for lowering manufacturing costs at the same time. The narrower separation regions may allow for more chips to be arranged on a wafer.

Furthermore, the dicing may include an etching process, and a depth to which the etching may be carried out may be adjusted such that a thermal impact on the active regions of the chips, which may be sensitive to heat, may be avoided by directing a heat introduced by a laser dicing process away from the active regions, e.g. towards deeper regions of the chip.

In various embodiments, in a wafer dicing process, a plasma etching process and a second dicing process may be combined. The plasma etching may be carried out in a plurality of separation regions, which may be arranged between active regions of a plurality of chips extending from a surface of the wafer into the wafer, in such a way that a trench formed by the plasma etching process may extend further from the surface of the wafer into the wafer than the active regions. The second dicing process may be used for forming a separation in material remaining in the separation regions, thereby completing the separating the plurality of chips.

FIG. 1A to FIG. 1F show various stages of a method of dicing a wafer in accordance with various embodiments.

As shown in FIG. 1A, a wafer 102 may, in various embodiments, have a first surface 1021 on a first side of the wafer and a second surface 1022 on a second side of the wafer opposite the first surface 1021. The wafer 102 may be a semiconductor wafer, e.g. a silicon wafer, a germanium wafer, a silicon germanium wafer, a gallium nitride wafer or the like. In other words, the wafer may include a semiconductor material, e.g. silicon, germanium, gallium nitride, or the like. The wafer may have a thickness 102T.

In various embodiments, the wafer 102 may include a material with a low dielectric constant, also referred to as low-k material 104 or low-k dielectric 104. The low-k material 104 may be formed on the first side of the wafer 102. It may, at least partially, for example, as shown in FIG. 1A, completely, form the first surface 1021 of the wafer 102. The low-k material 104 may, in various embodiments, be formed as a layer or as a plurality of layers, or as a portion of a layer or as portions of the plurality of layers. The low-k material 104 may for example be formed as a structured layer or as a plurality of structured layers. The low-k material 104 may be rather brittle.

In various embodiments, the method of dicing a wafer 102 may include forming a plurality of active regions 110 in the wafer 102. Each active region 110 of the plurality of active regions 110 may extend from the first surface 1021 of the wafer 102 into the wafer 102 by a height. The height of each active region 110 of the plurality of active regions 110 may also be referred to as its thickness 110T. In various embodiments, the thickness 110T may be smaller than the thickness 102T of the wafer 102. The thickness 110T may for example be smaller than about 95% of the thickness 102T of the wafer 102, e.g. smaller than about 80%, e.g. smaller than about 50%, e.g. smaller than about 10%.

In various embodiments, a portion of the wafer 102 underneath a level of the plurality of active regions 110 may be referred to as the substrate portion of the wafer 102. In various embodiments, the wafer 102 may have a thickness 102TS underneath the level of the plurality of active regions 110, i.e. the substrate portion of the wafer 102 may have the thickness 102TS. In other words, the thickness 102T of the wafer 102 may be a sum of the thickness 110T of the plurality of active regions 110 and the thickness 102TS of the substrate portion of the wafer 102.

In the following, unless specified differently, "each active region 110" and/or "the active region 110" may refer to each/the active region 110 of the plurality of active regions 110, and "active regions 110" may refer to the plurality of active regions 110.

In various embodiments, each active region 110 may include at least one material different from the semiconductor material of the wafer 102. Each active region 110 may for example include a metal or a metal alloy, e.g. copper, aluminum, copper-tin, titanium, or the like, for example for providing a redistribution layer, a via and/or an electrically conductive contact. Each active region may for example include at least one metallization layer, for example a plurality of metallization layers. The metallization layer closest to the second surface 1022 of the wafer 102 may be referred to as the lowest metallization layer or as the bottom metallization layer.

In various embodiments, each active region 110 may for example include a dielectric, e.g. silicon dioxide, silicon nitride, a material with a small dielectric constant (relative to, e.g., pure bulk silicon dioxide), e.g. the low-k material 104, e.g. fluorine-doped silicon dioxide, porous silicon dioxide, organic polymeric dielectrics, or the like, for example for electrically insulating electrically conductive structures from each other.

In various embodiments, during the forming of the active regions 110, a plurality of separation regions 112 may be formed. The plurality of active regions 110 may be separated by separation regions 112 of the plurality of separation regions 112. In other words, the active regions 110 may be formed in the wafer 102 in such a way that all active regions 110 of the plurality of active regions 110 that are adjacent to each other are separated by a separation region 112 of the plurality of separation regions 112. Furthermore, the active regions 110 may be formed in the wafer 102 in such a way that a separation region 112 of the plurality of separation regions 112 may be arranged between an active region 110 that is adjacent to an edge, e.g. a circumferential edge, of the wafer 102 and the edge of the wafer 102. In other words, the plurality of separation regions 112 may be arranged between and around the plurality of active regions 110.

In various embodiments of the method of dicing a wafer, the active regions 110 may be formed in the wafer 102 in such a way that the plurality of separation regions 112 may be free from metal, e.g. free from a metal layer (or a metal alloy layer) or from a portion of a metal layer (or a portion of a metal alloy layer). In other words, the plurality of separation regions 112 may not contain a metal or a metal alloy. In other words, a layout of the wafer 102 may be made such that the plurality of separation regions 112 is formed metal-free. In various embodiments, none of the plurality of separation regions 112 may contain a metal or a metal alloy.

In various embodiments, the plurality of separation regions 112 may furthermore be free from the low-k-dielectric 104.

In various embodiments, the plurality of separation regions 112 may only include the semiconductor material of the semiconductor wafer. In various embodiments, the plurality of separation regions 112 may include the semiconductor material of the semiconductor wafer and a regular (as opposed to low-k) dielectric material, e.g. silicon dioxide and/or silicon nitride.

In various embodiments, the method of dicing a wafer may include forming a mask 106, e.g. a structured mask 106, over the first surface 1021 of the wafer 102. The mask 106 may be a mask as it is commonly used in plasma etching processes, e.g. a photolithographic mask. The mask may for example include or essentially consist of a photoresist. The mask 106 may be structured, e.g. using photolithographic processes. In various embodiments, the mask 106 may be a hard mask, e.g. including silicon dioxide and/or silicon nitride.

In various embodiments, the mask 106 may be formed, e.g. structured, in such a way that at least a portion of the plurality of separation regions 112 at the first surface 1021 of the wafer 102 may be free from the mask 106. In other words, the mask 106 may include at least one opening 108, e.g. a trench, wherein the at least one opening 108 may be arranged over the plurality of separation regions 112.

Figure 1B:
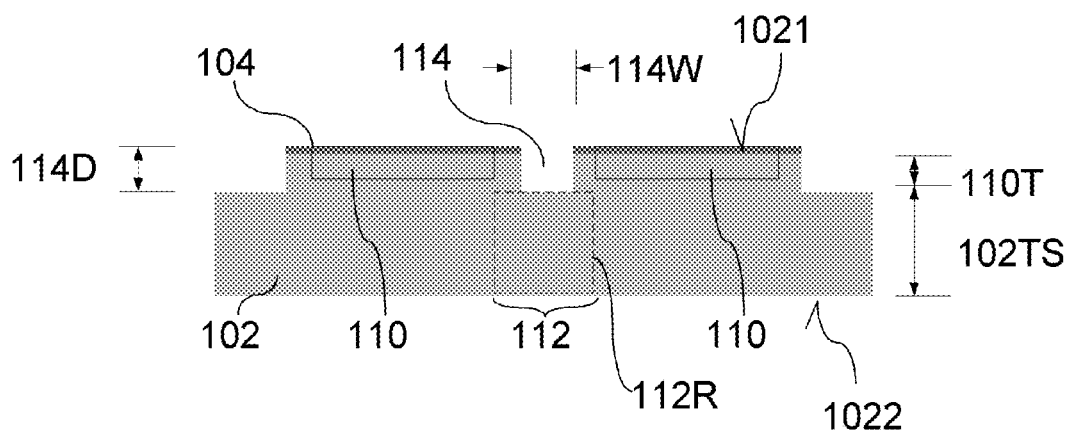

As shown in FIG. 1B, in various embodiments, the method of dicing a wafer may include forming at least one trench 114 in the wafer 102. The at least one trench 114 may be formed by plasma etching in at least one separation region 112 from the first surface 1021 of the wafer 102. A plasma etching process, e.g. an anisotropic etching process, e.g. a deep reactive ion etching, e.g. a Bosch etching process, may be used for forming the at least one trench 114 in the wafer 102. In various embodiments, since the at least one separation region 112 may be free from metal, an etching process suitable for etching metal may be omitted. In other words, a single plasma etching process suitable for etching the semiconductor material of the wafer 102, e.g. an anisotropic etching process, may be used for forming the at least one trench 114.

In various embodiments, the at least one trench 114 may have a width 114W in a range from about 10 µm to about 70 µm, e.g. in a range from about 15 µm to about 30 µm.

In various embodiments, the at least one trench 114 may be formed fully within the at least one separation region 112. In other words, side walls of the at least one trench 114 may not be formed at or in the plurality of active regions 110. As a consequence, the side walls of the at least one trench 114 may be free from metal (not labelled here, but see FIG. 3, where an upper surface 230SU of a semiconductor chip 230 may correspond to a side wall of at least one trench 114 formed during a dicing process of the semiconductor chip 230).

In various embodiments, the at least one trench 114 may extend into the wafer 102 farther than the plurality of active regions 110. A bottom of the at least one trench 114 may for example be arranged at a level, in a vertical direction, between the second surface 1022 of the wafer 102 and the lowest metallization layer of the plurality of active regions 110. In other words, a depth 114D of the trench 114 may be larger than the thickness 110T of the plurality of active regions 110. In yet other words, the trench 114 may extend into the substrate portion of the wafer 102. In yet other words, a difference $\Delta DT=114D-110T$ may be larger than zero.

In various embodiments, the single plasma etching process may be sufficient for forming the at least one trench 114 with the depth 114D being larger than the thickness of the plurality of active regions 110.

In various embodiments, the depth 114D of the trench 114 may be smaller than the thickness 102T of the wafer 102. In other words, after the etching of the trench 114, a portion of the separation region 112 below a level of a bottom of the trench 114 may remain. This is indicated by a dashed rectangle in e.g. FIG. 1B. The portion of the separation region 112 may be referred to as the remaining portion 112R or as the bottom portion 112R.

In various embodiments, the depth 114D of the trench 114 may be substantially larger than the thickness 110T of the plurality of active regions 110. The depth 114D of the trench 114 may for example be larger by more than about 1 nm, e.g. by more than about 5 nm. This may for example be the case if, during a subsequent processing of the wafer 102 for completing the dicing of the wafer 102, heat may be introduced into the wafer 102, e.g. during a laser processing of the wafer 102. In various embodiments, the difference $\Delta DT$ may be adjusted according to an amount of heat introduced in to the wafer 102, for example depending on a laser output power, a wavelength of the laser light, etc. The higher the amount of heat introduced into the wafer 102, the larger the difference $\Delta DT$ that may be selected for the forming of the trench 114. By way of example, when using an infrared laser for the further dicing process, the difference $\Delta DT$ may be larger than in a case where a blue laser is used.

In various embodiments, the depth 114D of the trench 114 may be substantially larger than the thickness 110T of the plurality of active regions 110 without later laser processing.

In various embodiments, the depth 114D of the trench 114 may be only slightly larger than the thickness 110T of the plurality of active regions 110. The depth 114D of the trench 114 may for example be larger by less than about 1 nm, e.g. by less than about 500 nm. This may for example be the case if, during a subsequent processing of the wafer 102 for completing the dicing of the wafer 102, mechanical processes, e.g. sawing, may be used. However, the depth 114D of the trench 114 may be only slightly larger than the thickness 110T of the plurality of active regions 110 even if laser processing is carried out for dicing the wafer 102.

In various embodiments, by having the at least one trench 114 extend into the substrate region of the wafer 102, a damage to one or more of the active regions 110, e.g. by overheating, may be avoided, because a portion of the plurality of separation regions 112 that may remain after the forming the at least one trench 114 and may need to be separated, e.g. by laser processing, e.g. laser ablation or laser stealth dicing, may be far enough away from the plurality of active regions 110 to cause a temperature increase to a damaging level at the plurality of active regions 110. In other words, the at least one trench 114 may be formed deep enough, with a large enough difference $\Delta DT$, to ensure that the temperature at the plurality of active regions 110 stays below a damaging level.

In various embodiments, by having the at least one trench 114 extend into the substrate region of the wafer 102, a damage to one or more of the active regions 110, e.g. by causing a crack to extend into one or more of the active regions 110, may be avoided, because a portion of the plurality of separation regions 112 that may remain after the forming the at least one trench 114 and may need to be separated, e.g. by sawing or by cracking as part of the laser stealth dicing, may be far enough away from the plurality of active regions 110 and/or may be broad enough such that a crack that may for example start in the remaining portion of the plurality of separation regions 112 (e.g. deliberately as part of the stealth dicing and/or accidentally) may propagate towards the trench 114 and end there, rather than propagating into one or more of the plurality of active regions 110.

In various embodiments, after the etching, the mask 106 may be removed, e.g. the photoresist may be stripped.

Figure 3:
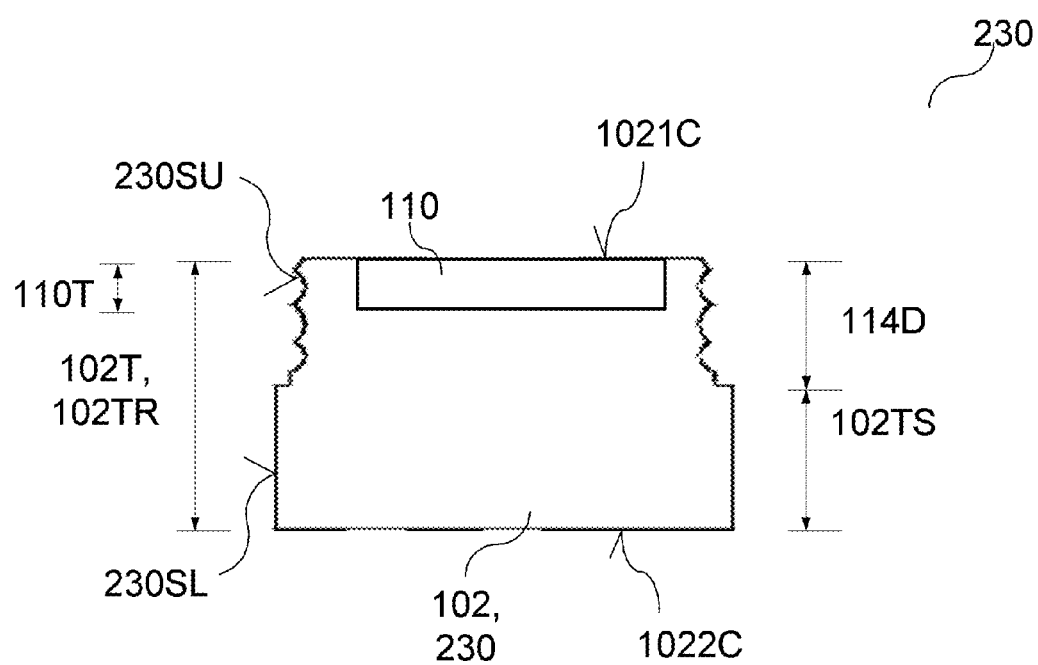
FIG. 3 shows a schematic cross-sectional view of a semiconductor chip in accordance with various embodiments.

In various embodiments, as shown in FIG. 1C to FIG. 1F, the remaining portion 112R may be processed, e.g. treated, to separate the wafer 102 into individual chips (e.g. like a chip 230 shown in FIG. 3). The separating of the wafer 102 into individual chips may also be referred to as dicing of the wafer 102.

Figure 1C:
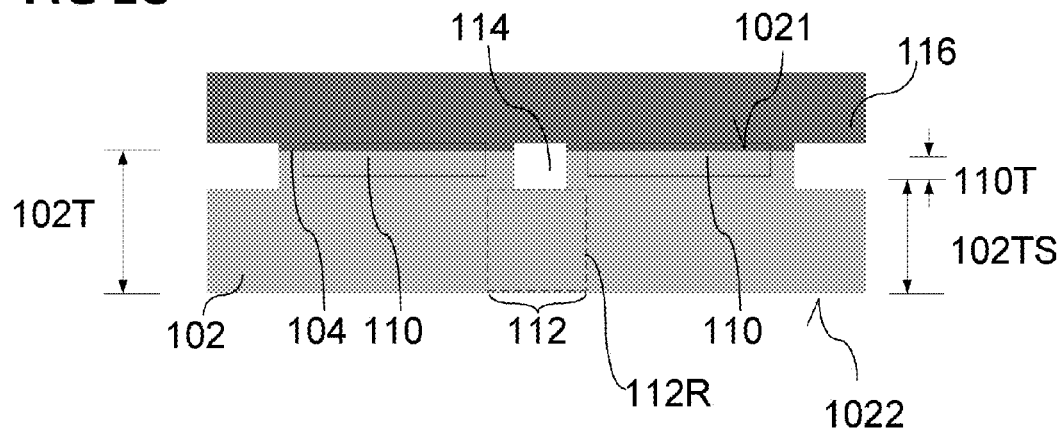

As shown in FIG. 1C, in various embodiments, the method of dicing a wafer may further include attaching a layer 116 to the first surface 1021 of the wafer 102, e.g. fixing a layer 116 to the first surface 1021 of the wafer 102. The layer 116 may for example be a grinding tape. The wafer 102 may be mounted for grinding from the second surface 1022 of the wafer 102. As the layer 116, a typical grinding layer, e.g. a typical grinding tape, for example a soft, adhesive, UV- or heat releasable PET film, may be used.

Figure 1D:
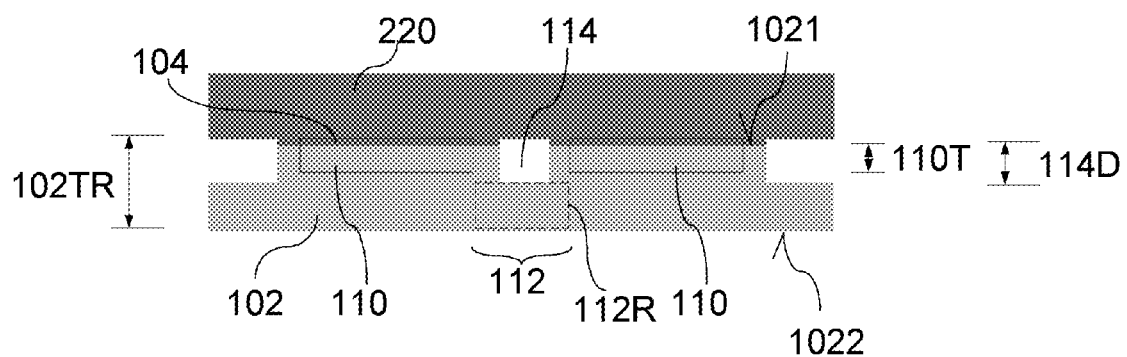

In various embodiments, the method of dicing a wafer may further include grinding the wafer 102. The wafer 102 may be ground from the second surface 1022 of the wafer 102. After the grinding, as shown in FIG. 1D, the thickness 102T of the wafer 102 may be reduced to a reduced thickness 102TR. The reduced thickness 102TR of the wafer 102 may be larger than the depth of the trench 114D. In other words, the grinding may not completely remove the remaining portion 112R.

In various embodiments, the method of dicing a wafer may further include mounting, e.g. re-mounting, the wafer 102 onto a dicing layer 220, e.g. on a dicing tape 220. The dicing layer 220 may be attached to the first surface 1021 of the wafer 102. Thus, the second surface 1022 of the wafer 102 may be accessible for processing, e.g. for laser processing. Alternatively, the dicing layer 220 may be attached to the second surface 1022 of the wafer 102, e.g. in a case where processing the remaining portion 112R from the first side of the wafer 102 may be possible, e.g. if an aspect ratio of the trench 114, e.g. a ratio of the depth 114D of the trench 114 over the width 114W of the trench, is small enough such that the remaining portion 112R may be treated from the first side of the wafer 102, or for example in a case processing the remaining portion 112R from the second side of the wafer 102 may be possible despite a presence of the dicing layer 220, e.g. if the dicing layer 220 is essentially transparent for light emitted by the laser.

As the dicing layer 220, e.g. the dicing tape 220, a typical dicing layer 220, e.g. a typical dicing tape, e.g. a typical dicing tape suitable for laser (e.g. stealth) dicing may be used. The dicing layer 220 may for example be configured to withstand a large amount of heat that may be introduced into the dicing layer 220 during the dicing process by the laser, and/or the dicing layer 220 may be for example be porous and/or provide strong adhesion for draining/withstanding water that may be supplied for cooling purposes during the laser dicing process, and/or the dicing layer 220 may for example be transparent to the laser wavelength.

Figure 1E:
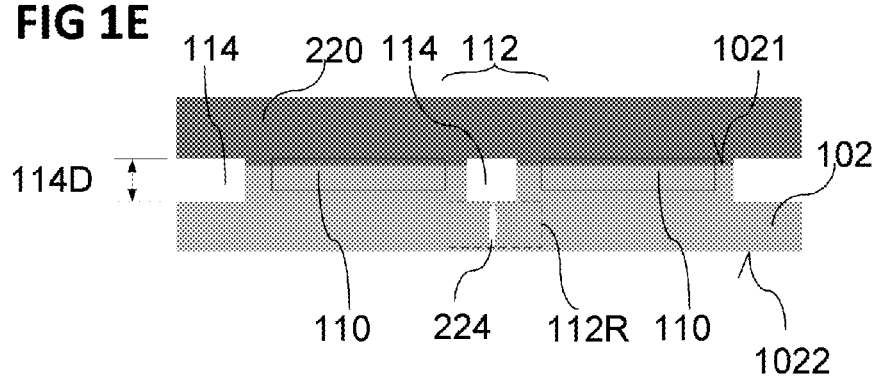

In various embodiments, as shown in FIG. 1E, the processing, e.g. treating, the remaining portion 102B of the wafer 102 may include laser stealth dicing. The laser stealth dicing may include irradiating the remaining portion 112R with a laser, such that a region 224 with a modified structure, e.g. a modified crystal structure, may form. The region 224 with the modified structure may form a defect region. By way of example, the irradiating with the laser may change a monocrystalline semiconductor material to a polycrystalline semiconductor material. However, the semiconductor material of the wafer 102 may not—or at least not significantly—be removed by the irradiating with the laser. The region 224 with the modified structure may be more fragile than portions of the wafer 102 that may not have been treated with the laser. In various embodiments, the conventional laser stealth dicing process may be carried out.

In various embodiments, the region 224 may have a width in a range from about 5 µm to about 30 µm, e.g. about 10 µm.

In various embodiments, the width 114W of the trench 114 may be larger than the width of the region 224. Thereby, it may be ensured that one end of a fracture 228 (see FIG. 2F) to be caused in the region 224 as described below may be located at a bottom of the trench 114.

In various embodiments, the laser used for the laser stealth dicing may be an infrared laser. A wavelength of the laser may for example be larger than about 750 nm. The laser may for example be a Nd:YAG laser, e.g. a pulsed Nd:YAG laser, with a wavelength of 1064 nm. In various embodiments, a laser with a different wavelength and/or with other differing properties may be used for the laser stealth dicing.

Figure 1F:
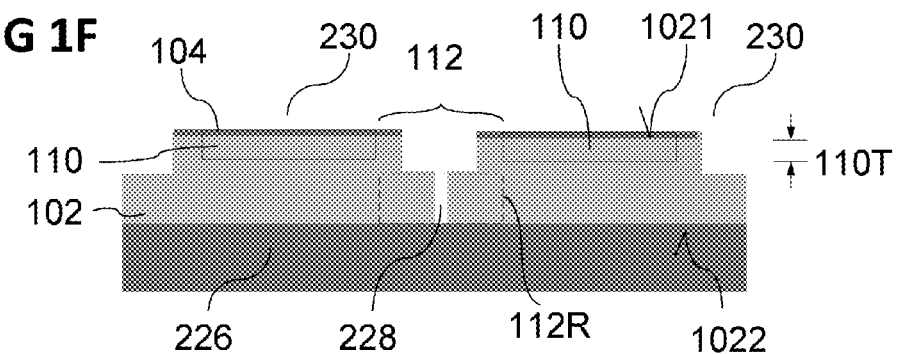

As a consequence, as shown in FIG. 1F, by applying an expanding lateral force on the wafer 102 including the region 224 with the modified structure, the wafer 102 may fracture at the region 224 with the modified structure. By way of example, a fracture 228 (also referred to as crack 228 or separation 228) may form in the region 224 with the modified structure, extending from the second surface 1022 of the wafer 102 to the trench 114.

For applying the expanding lateral force on the wafer 102, the wafer 102 may be attached to, e.g. fixed on, an expanding layer 226, e.g. on an expanding tape 226. As the expanding layer 226, a typical expanding layer 226, e.g. a typical expanding tape, e.g. an expandable synthetic resin film, may be used. In various embodiments, the dicing layer 220 may be expandable, such that no dedicated expanding layer 226 may be required.

By pulling an edge or edges of the expanding layer 226 in opposite lateral directions, e.g. in two pairs of opposite lateral directions or in radial directions, the expanding lateral force on the wafer 102 may be applied. The wafer 102 may crack at the one or more regions 224 with the modified structure. The wafer 102 may form the separation 228. Thereby, a plurality of individual semiconductor chips 230 may be formed.

In various embodiments, as shown in FIG. 2F, the expanding layer 226 may be applied to the second surface 1022 of the wafer 102. Alternatively, the expanding layer 226 may be applied to the first surface 1021 of the wafer 102.

In various embodiments, as described above, the method of dicing a wafer may include attaching the wafer 102 to a temporary support structure 116, 220, 226. The temporary support structure 116, 220, 226 may, in various embodiments, include or essentially consist of a grinding layer 116, a dicing layer 220 and/or an expanding layer 226. In various embodiments, exactly one temporary support structure 116, 220, 226 may be attached to the wafer 102 while the wafer 102 is being processed. Depending on the process that may be carried out with the wafer 102 being attached, e.g. fixed, to the temporary support structure 116, 220, 226, the temporary support structure 116, 220, 226 may be attached to the first surface 1021 or to the second surface 1022 of the wafer 102.

FIGS. 2A to 2F show various stages of a method of dicing a wafer 102 in accordance with various embodiments.

In various embodiments, the processes shown in FIG. 2A to FIG. 2D may be identical to the processes shown in FIG. 1A to FIG. 1D, respectively.

Figure 2A:
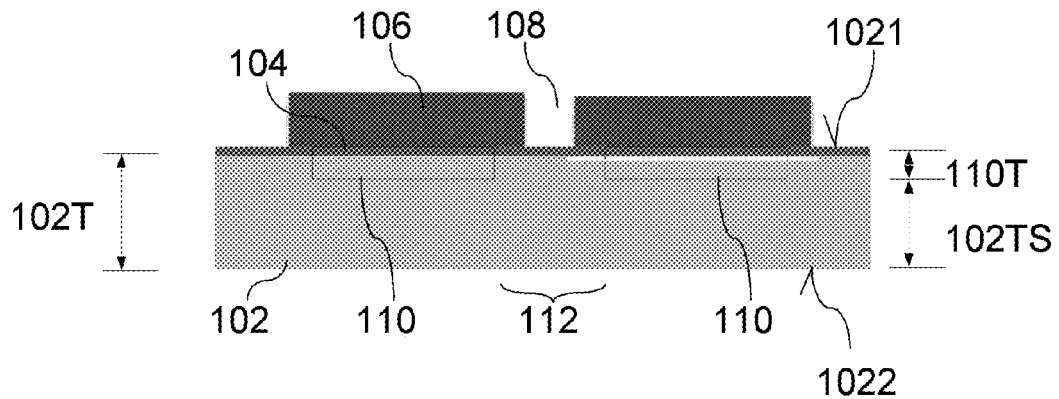
Figure 2B:
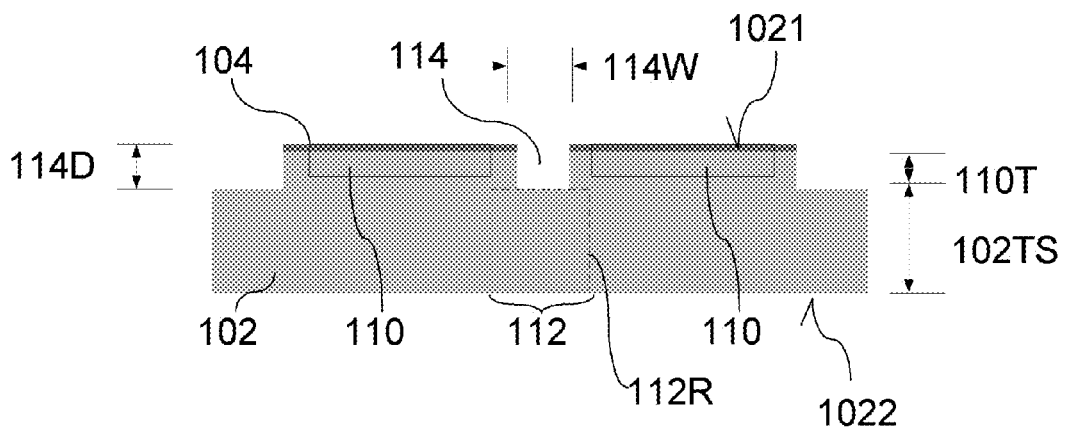
Figure 2C:
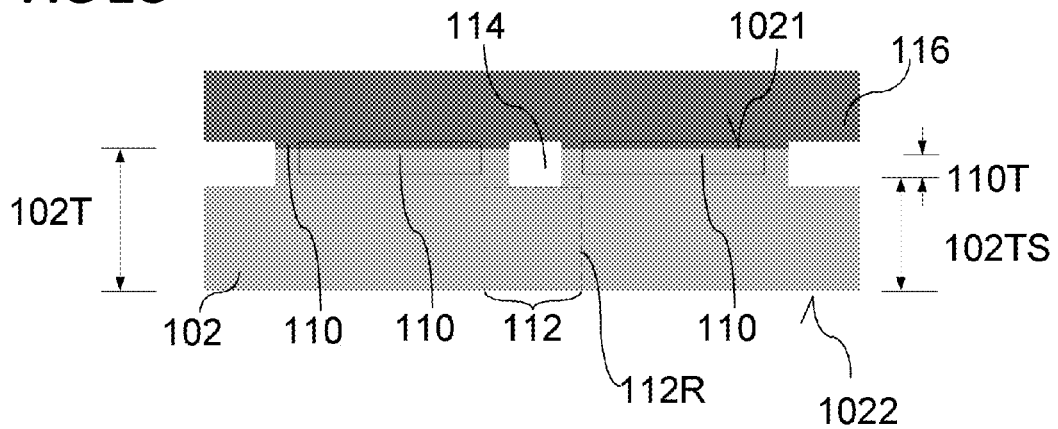

The process shown in FIGS. 2A to 2F may differ from the process shown in FIGS. 1A to 1F mainly in that, as shown in FIG. 2E, the treating the remaining portion 112R of the wafer 102 may not include laser stealth dicing.

In various embodiments, the treating the remaining portion 112R of the wafer 102 may include laser ablating. In other words, a laser may be used for partly removing semiconductor material from the separation region 112 of the wafer 102.

In various embodiments, the laser used for the laser ablating may be similar or identical to the laser described above used for the laser stealth dicing. However, the laser may be configured to partially remove the semiconductor material. In various embodiments, one or more parameters of the laser and/or its operation may be modified as compared to the laser stealth dicing, such that an energy introduced into a treated portion of the separation region 112 of the wafer 102 may be sufficient for ablating the semiconductor material. By way of example, the laser energy, pulse duration, pulse frequency, and/or scanning speed, etc. may be adjusted for the ablating of the semiconductor material.

In various embodiments, using the laser ablating, a separation 228 may be formed in the wafer 102, e.g. in the separation region 112 of the wafer 102, e.g. in the remaining portion 112R of the separation region 112.

In various embodiments, the separation 228 formed by the laser ablating may have a width in a range from about 5 μm to about 20 μm, e.g. about 10 μm.

In various embodiments, the treating the remaining portion 112R of the wafer 102 may include sawing. Using the sawing, the separation 228 may be formed in the wafer 102, e.g. in the separation region 112 of the wafer 102, e.g. in the remaining portion 112R of the separation region 112.

In various embodiments, the sawing may be carried out, e.g. using a thin sawing blade, e.g. a sawing blade with a thickness in a range from about 10 μm to about 50 μm. Thus, the separation 228 formed by the sawing may have a width in a range from about 10 μm to about 50 μm.

In various embodiments, other processes may be used for forming the separation 228 in the remaining portion 112R of the separation region 112.

In various embodiments, a width 114W of the trench 114 may be larger than the separation 228, which may correspond to a separation between individual chips 230 formed by the treating the remaining portion 112R of the wafer 102.

In various embodiments, by the laser ablating, the sawing or the like, the separation 228 may be formed. Thereby, the wafer 102 may be separated (diced) into individual chips 230. As opposed to the process shown in FIG. 1A to FIG. 1F, the separated individual chips 230 may already be present after the process shown in FIG. 2E, i.e. after the forming the separation 228 by laser ablating, sawing, or the like.

In various embodiments, as shown in FIG. 2F, an optional expanding using an expanding layer 226 and an expanding process as described in context with FIG. 1F, may be used for increasing the width of the separation 228.

FIG. 3 shows a schematic cross-sectional view of a semiconductor chip 230 in accordance with various embodiments.

In various embodiments, the semiconductor chip 230 may include a first surface 1021C including at least one active region 110, a second surface 1022C opposite the first surface 1021C, and at least one side surface 230SU, 230SL connecting the first surface 1021C and the second surface 1022C. The semiconductor chip 230 may for example have an approximately cuboid shape, and the at least one side surface 230SU, 230SL may be four side surfaces 230SU, 230SL connecting the first surface 1021C and the second surface 1022C.

In various embodiments, the first surface 1021C of the semiconductor chip 230 may be a portion of the first surface 1021 of the wafer 102 described above, and the second surface 1022C of the semiconductor chip 230 may be a portion of the second surface 1022 of the wafer 102 described above.

In various embodiments, a first part 230SU of the at least one side surface 230SU, 230SL forming a common edge with the first surface 1021C may be formed by plasma etching.

The first part 230SU of the at least one side surface 230SU, 230SL, also referred to as the upper part 230SU of the at least one side surface 230SU, 230SL, may for example be formed as a part, e.g. a side wall, of the at least one trench 114 described above.

In various embodiments, a shape of the first part 230SU of the at least one side surface 230SU, 230SL may be characteristic for a formation by plasma etching. The first part 230SU of the at least one side surface 230SU, 230SL may for example have an undulating wall shape, which may also be described as a comb-like wall shape or a wavy shape, that may originate from an alternating of etching and passivation during an execution of the plasma etching, e.g. a deep reactive-ion etching. The plasma etching may be carried out for example as described above.

The first part 230SU of the at least one side surface 230SU, 230SL may have a height 114D (which may be identical to the depth of the trench 114 described above) that may be larger than a thickness 110T of the active region 110, as described above.

In various embodiments, a second part 230SL of the at least one side surface 230SU, 230SL forming a common edge with the second surface 1022C, may be formed by laser treatment and/or mechanical dicing.

The second part 230SL of the at least one side surface 230SU, 230SL, also referred to as the lower side surface 230SL of the at least one side surface 230SU, 230SL, may for example be formed, as described above, by a process carried out for the further processing of the remaining portion 114R of the wafer 102 in the separation region 114 to separate the wafer into individual chips 230. It may for example be formed by laser stealth dicing (i.e. laser irradiation followed by mechanical separation), by laser ablation, by sawing or by other (e.g. mechanical) suitable separation methods.

In various embodiments, a shape of the second part 230SL of the at least one side surface 230SU, 230SL may be characteristic for a formation by the process used for the further processing of the remaining portion 112R of the wafer 102 in the separation region 112 to separate the wafer into individual chips 230. The shape of the second part 230SL of the at least one side surface 230SU, 230SL may for example be characteristic for a formation by laser stealth dicing, e.g. a very smooth surface, or for laser ablation, e.g. a very smooth surface that may show some indication of melting, or a moderately rough surface characteristically formed by sawing.

In various embodiments, as described above, the at least one trench 114 may be formed completely within the separation region 112. As a consequence, the at least one side surface 230SU, 230SL may be free from metal.

FIG. 4 shows a schematic process flow 600 of a method of dicing a wafer in accordance with various embodiments.

In various embodiments, the method may include forming a plurality of active regions in a wafer, each active region including at least one electronic component, the active regions extending from a first surface of the wafer into the wafer by a height and being separated by separation regions, the separation regions being free from metal (in 610).

In various embodiments, the method may further include forming at least one trench in the wafer by plasma etching in at least one separation region from the first surface of the wafer, wherein the at least one trench is extending into the wafer farther than the plurality of active regions (in 620).

In various embodiments, the method may further include processing a remaining portion of the wafer in the separation region to separate the wafer into individual chips (in 630).

In various embodiments, a method of dicing a wafer is provided. The method may include forming a plurality of active regions in a wafer, each active region including at least one electronic component, the active regions extending from a first surface of the wafer into the wafer by a height and being separated by separation regions, the separation regions being free from metal, forming at least one trench in the wafer by plasma etching in at least one separation region from the first surface of the wafer. The at least one trench is extending into the wafer farther than the plurality of active regions, and processing a remaining portion of the wafer in the separation region to separate the wafer into individual chips.

In various embodiments, the treating the remaining portion of the wafer may include at least one of laser ablating or laser stealth dicing. A wavelength of a laser used for the laser ablating or the laser stealth dicing may be larger than about 750 nm. In various embodiments, the treating the remaining portion of the wafer may include sawing. In various embodiments, the method may further include fixing the first surface of the wafer to a temporary support structure before the treating the remaining portion of the wafer.

In various embodiments, the method may further include fixing a second surface of the wafer opposite the first surface to a temporary support structure before the treating the remaining portion of the wafer. In various embodiments, the treating the remaining portion of the wafer may be carried out from a first side of the wafer, wherein the first surface of the wafer may be located on the first side of the wafer. The treating the remaining portion of the wafer may be carried out from a second side of the wafer opposite the first side of the wafer. A width of the trench may be larger than a separation between the individual chips formed by the treating the remaining portion of the wafer.

In various embodiments, a semiconductor chip is provided. The semiconductor chip may include a first surface including at least one active region, a second surface opposite the first surface, and at least one side surface connecting the first surface and the second surface. A first part of the at least one side surface forming a common edge with the first surface may be formed by plasma etching. A second part of the at least one side surface forming a common edge with the second surface may be formed by laser treatment and/or mechanical dicing. The at least one side surface may be free from metal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of dicing a wafer, the method comprising:
forming a plurality of active regions in a wafer, each active region comprising at least one electronic component, the active regions extending from a first surface of the wafer into the wafer by a height and being separated by separation regions, the separation regions being free from metal;
forming at least one trench in the wafer by plasma etching in at least one separation region from the first surface of the wafer, wherein the at least one trench is extending into the wafer farther than the plurality of active regions; and
processing a remaining portion of the wafer in the separation region to separate the wafer into individual chips,
wherein the processing the remaining portion of the wafer comprises at least one of laser ablating, laser stealth dicing, and sawing.

2. The method of claim 1,
wherein a wavelength of a laser used for the laser ablating or the laser stealth dicing is longer than about 750 nm.

3. The method of claim 1,
wherein the processing the remaining portion of the wafer is carried out from a first side of the wafer, wherein the first surface of the wafer is located on the first side of the wafer.

4. The method of claim 1,
wherein processing the remaining portion of the wafer is performed at a predefined distance below the plurality of active regions of the wafer.

5. The method of claim 4,
wherein the predefined distance is based on an expected heat transfer to the wafer from the at least one of laser ablating and laser stealth dicing.

6. The method of claim 1,
wherein processing the remaining portion of the wafer comprises modifying a structure of the remaining portion to form at least one defect region.

7. The method of claim 6,
wherein the at least one defect region is narrower than a width of the at least one trench.

8. The method of claim 6, further comprising:
applying an expanding lateral force to fracture the at least one defect region separating the wafer into the individual chips.

9. The method of claim 1,
wherein processing the remaining portion of the wafer comprises forming at least one detachment region in the remaining portion separating the wafer into the individual chips.

10. The method of claim 9,
wherein the at least one detachment region is narrower than a width of the at least one trench.

11. The method of claim 1,
wherein the plurality of active regions is formed in a semiconductor material of the wafer.

12. The method of claim 11,
wherein the separation regions being free from metal comprise the semiconductor material.

13. A method of dicing a wafer, the method comprising:
forming a plurality of active regions in a wafer, each active region comprising at least one electronic component, the active regions extending from a first surface of the wafer into the wafer by a height and being separated by separation regions, the separation regions being free from metal;
forming at least one trench in the wafer by plasma etching in at least one separation region from the first surface of the wafer, wherein the at least one trench is extending into the wafer farther than the plurality of active regions;
processing a remaining portion of the wafer in the separation region to separate the wafer into individual chips; and
fixing the first surface of the wafer or fixing a second surface of the wafer opposite the first surface to a temporary support structure before the processing the remaining portion of the wafer.

14. A method of dicing a wafer, the method comprising:
forming a plurality of active regions in a wafer, each active region comprising at least one electronic component, the active regions extending from a first surface of the wafer into the wafer by a height and being separated by separation regions, the separation regions being free from metal;
forming at least one trench in the wafer by plasma etching in at least one separation region from the first surface of the wafer, wherein the at least one trench is extending into the wafer farther than the plurality of active regions; and processing a remaining portion of the wafer in the separation region to separate the wafer into individual chips, wherein the processing the remaining portion of the wafer is carried out from a second side of the wafer opposite first side of the wafer, wherein the first surface of the wafer is located on the first side of the wafer.

15. A method of dicing a wafer, the method comprising:

forming a plurality of active regions in a wafer, each active region comprising at least one electronic component, the active regions extending from a first surface of the wafer into the wafer by a height and being separated by separation regions, the separation regions being free from metal;

forming at least one trench in the wafer by plasma etching in at least one separation region from the first surface of the wafer, wherein the at least one trench is extending into the wafer farther than the plurality of active regions; and processing a remaining portion of the wafer in the separation region to separate the wafer into individual chips, wherein a width of the trench is larger than a separation between the individual chips formed by the processing the remaining portion of the wafer.

* * * * *